United States Patent
Hong et al.

(10) Patent No.: US 7,517,793 B2
(45) Date of Patent: Apr. 14, 2009

(54) METHOD OF FORMING METAL WIRE IN SEMICONDUCTOR DEVICE

(75) Inventors: Seung Hee Hong, Seoul (KR); Cheol Mo Jeong, Icheon-si (KR); Jung Geun Kim, Seoul (KR); Eun Soo Kim, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 2 days.

(21) Appl. No.: 11/753,543

(22) Filed: May 24, 2007

(65) Prior Publication Data

US 2008/0146023 A1    Jun. 19, 2008

(30) Foreign Application Priority Data

Dec. 13, 2006    (KR) .................... 10-2006-0127169

(51) Int. Cl.
H01L 21/4763    (2006.01)
(52) U.S. Cl. ................ 438/627; 438/643; 438/688; 257/E21.575
(58) Field of Classification Search ............. 438/627, 438/643, 688
See application file for complete search history.

(56) References Cited

U.S. PATENT DOCUMENTS

| | | | | |
|---|---|---|---|---|
| 6,121,149 | A * | 9/2000 | Lukanc et al. ............. 438/692 |
| 6,228,755 | B1 * | 5/2001 | Kusumi et al. ............. 438/618 |
| 6,251,774 | B1 * | 6/2001 | Harada et al. ............. 438/637 |
| 6,451,673 | B1 * | 9/2002 | Okada et al. ............. 438/513 |
| 6,472,231 | B1 * | 10/2002 | Gabriel et al. ............. 438/9 |
| 2003/0129847 | A1 * | 7/2003 | Celii et al. ............. 438/706 |
| 2003/0160333 | A1 * | 8/2003 | Kim et al. ............. 257/774 |
| 2004/0253807 | A1 * | 12/2004 | Thei et al. ............. 438/627 |
| 2005/0179141 | A1 * | 8/2005 | Yun et al. ............. 257/774 |
| 2007/0059925 | A1 * | 3/2007 | Choi et al. ............. 438/640 |

FOREIGN PATENT DOCUMENTS

| KR | 1020000022650 A | 4/2000 |
|---|---|---|
| KR | 1020010112964 A | 12/2001 |

* cited by examiner

*Primary Examiner*—George Fourson
*Assistant Examiner*—John M Parker
(74) *Attorney, Agent, or Firm*—Townsend and Townsend and Crew LLP

(57) ABSTRACT

A method of forming a metal wire in a semiconductor device includes performing a first etching process on an insulating layer formed on a semiconductor substrate to form a trench and an insulating layer pattern, the insulating layer pattern defining the trench. A barrier metal layer is formed over the insulating layer pattern and the trench. A second etching process is performed on the barrier metal layer to expose upper corners of the trench while leaving the trench substantially covered with the barrier metal layer. A metal layer is formed over the barrier metal layer in the trench. A heat treatment process is performed for reflowing the metal layer. The metal layer is planarized.

15 Claims, 2 Drawing Sheets

METHOD OF FORMING METAL WIRE IN SEMICONDUCTOR DEVICE

CROSS-REFERENCES TO RELATED APPLICATIONS

The present application claims priority to Korean patent application number 10-2006-127169, filed on Dec. 13, 2006, which is incorporated by reference in its entirety.

BACKGROUND OF THE INVENTION

The present invention relates to a method of forming a metal wire in a semiconductor device, and more particularly to, a method in which a metal layer having a low specific resistance is formed selectively on only a barrier metal layer through a chemical vapor deposition method and a heat treatment process and a planarizing process for the metal layer are sequentially performed to form a metal wire having a low resistance.

A semiconductor device comprises of a transistor, a resistor, a capacitor and the like. A metal wire is an indispensable structural element for embodying such a semiconductor device on a semiconductor substrate. A function of the metal wire is to transmit an electrical signal, and so the metal wire should have a low resistance and a high reliability.

In general, the metal wire in the semiconductor device is formed through a damascene method. A process of forming the metal wire in the semiconductor device utilizing the damascene method is briefly described below. First, after forming an inter-insulating layer over the semiconductor substrate on which predetermined structures such as a gate and the like are formed, a trench is formed and a barrier metal layer made of titanium (Ti)/titanium nitride (TiN) is formed on the inter-insulating layer and the trench. Subsequently, a tungsten layer is formed on the barrier metal layer to fill the trench and the tungsten layer and some region of the titanium (Ti)/titanium nitride (TiN) barrier metal layer are then etched to form a tungsten metal wire.

Recently, as the semiconductor device becomes highly integrated and miniaturized, a width and thickness of the metal wire has been gradually reduced, also higher program speeds has been required. However, in a case where a tungsten plug is formed by utilizing tungsten damascene, due to a characteristic of the device which becomes integrated, it is difficult to obtain a capacitance characteristic because of the reduction of a space between the metals.

In order to solve the above capacitance problem, a capacitance value should be reduced by decreasing a height of the metal in an interconnection process. However, the reduced height increases the resistance value. A method which reduces a height of the metal line to secure a capacitance value and not change a resistance value is to introduce an interconnection with material having a lower Rs characteristic. Accordingly, as a process for substituting a tungsten plug, a plug process utilizing cooper (Cu) having a low Rs characteristic and being used in a logic device and aluminum (Al) utilized currently as wire material has been studied.

However, if aluminum is introduced through a chemical vapor deposition method for applying the current damascene method, an aluminum layer is formed on an entire upper surface of barrier metal layer. Due to the above, when a chemical mechanical polishing process is performed for forming a metal wire, problems such as dishing, scratches and the like are generated on the soft aluminum layer, these factors act to lower a reliability of the metal wire.

SUMMARY OF THE INVENTION

Accordingly, the present invention relates to a method of forming a metal wire in a semiconductor device in which a metal layer having a low specific resistance is formed selectively on only a barrier metal layer in a trench through a chemical vapor deposition method and a heat treatment process and a planarizing process for the metal layer are sequentially performed to enable a metal wire having a low resistance to be formed.

In order to achieve the above-mentioned objects, the method of forming a metal wire in a semiconductor device according to the present invention comprises the steps of performing a first etching process for an insulating layer formed on a semiconductor substrate to form a trench; forming a barrier metal layer on an insulating layer pattern including the trench; performing a second etching process for the barrier metal layer to expose a portion of upper side and side wall of the insulating layer pattern; forming a metal layer on the barrier metal layer in the trench; performing a heat treatment process for reflowing the metal layer; and planarizing the metal layer.

Here, the insulating layer pattern is formed by stacking subsequently a first oxide layer, a nitride layer and a second oxide layer. The barrier metal layer is formed of a titanium/titanium nitride (Ti/TiN) stacking layer. The barrier metal layer is remained on a bottom surface of the trench and a side wall of the first oxide layer of the insulating layer pattern. The barrier metal layer is etched by a RF (Radio Frequency) etching method. The RF etching process is carried out under the condition of reaction gas of argon (Ar) and a RF power of 100 to 500 W. In the radio-frequency etching process, a portion of the second oxide layer of the insulating layer pattern is slantly etched after the barrier metal layer formed on the insulating layer pattern is removed and a portion of the nitride layer is then slantly etched, the radio-frequency etching process is halted at a border between the nitride layer and the first oxide layer.

The metal layer is made of aluminum. The aluminum is deposited through a chemical vapor deposition (CVD) method utilizing methyl pyrrolidine alane (MPA; (CH3)(CH2)4N.AlH3)) source as a precursor. The chemical vapor deposition method utilizing methyl pyrrolidine alane (MPA) source as the precursor is performed at a temperature of 130° C. to 140° C.

The semiconductor substrate is heated to a temperature of 420° C. to 450° C. during the heat treatment process. The metal layer is planarized through a chemical mechanical polishing process until the nitride layer of the insulating layer pattern is exposed. The second oxide layer and the nitride layer of the insulating layer pattern are polished during the planarizing step.

The method of forming a metal wire in a semiconductor device according to the present invention further comprises the step of forming a hard mask layer before the first etching process for the insulating layer and further comprises the step of forming an insulating layer after planarizing the metal layer.

DESCRIPTION OF SPECIFIC EMBODIMENTS

Hereinafter, an embodiment of the present invention will be described in more detail with reference to the accompanying drawings. However, the embodiments of the present invention may be modified, it should be understood that a scope of the present invention is not limited to the embodiments described below, the embodiment is provided for illustrating more completely the present invention to those skilled in the art.

Figure 1A:
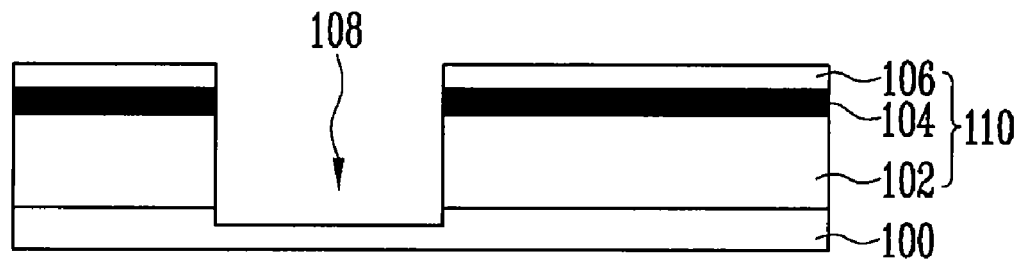
FIG. 1A to FIG. 1F are sectional views of a semiconductor device for illustrating a method of forming a metal wire in a semiconductor device according to an embodiment of the present invention.

First, referring to FIG. 1A, a first oxide layer 102, a nitride layer 104 and a second oxide layer 106 are sequentially formed on a semiconductor substrate 100 to form an insulating layer, the insulating layer is then patterned through a photolithography process and an etching process utilizing a mask (not shown) to form an insulating layer pattern 110 having a trench 108.

The first oxide layer 102 can be made of silicon oxide ($SiO_2$). In this case, the first oxide layer may be formed through an oxidation process or a chemical vapor deposition (CVD) method, e.g., a low pressure chemical vapor deposition (LPCVD) method. On the other hand, a target thickness of the first oxide layer 102 is determined from a thickness of a metal wire to be formed subsequently on a barrier metal layer (not shown) in the trench 108

The nitride layer 104 is a polishing stopper indicating an end point in a planarizing process utilizing the subsequent chemical mechanical polishing (CMP) method for forming the metal wire, this nitride layer may be formed of a layer made of nitride-based material (hereinafter, referred to as "nitride layer") such as silicon nitride ($Si_xN_y$) layer or silicon oxide nitride (SiON) layer. Also, the second oxide layer 106 can be formed of a silicon oxide ($SiO_2$) layer. The nitride layer 104 and the second oxide layer 106 can be formed through a chemical vapor oxidation (CVD) method, e.g., a low pressure chemical vapor oxidation (LPCVD) method.

On the other hand, in order to protect the insulating layer when a patterning process utilizing a mask is performed, a hard mask layer (not shown) having a stack structure of an oxide layer and a nitride layer can be formed on the second oxide layer 106. Subsequently, the hard mask layer and the mask are removed. The insulating layer pattern 110 formed as described above and including the trench 108 is generally called "the damascene pattern".

Figure 1B:
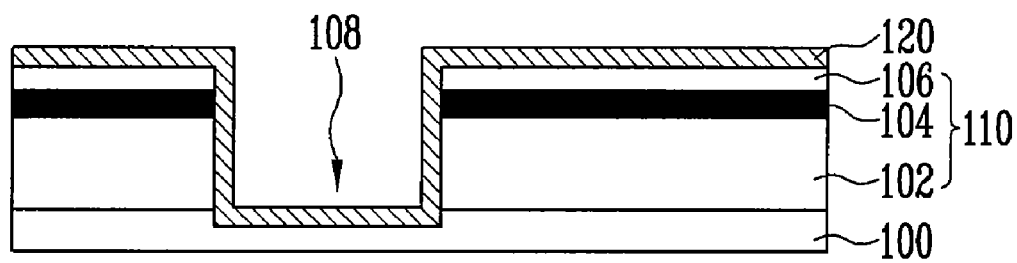

Referring to FIG. 1B, a barrier metal layer 120 is formed on the insulating layer pattern 110 including the trench 108. The barrier metal layer 120 is for preventing a metal layer from being lifted from the insulating layer pattern 110 and a junction spiking phenomenon (caused by diffusing metal material to a lower substrate) from being generated when a metal layer is formed in a subsequent process. The barrier metal layer 120 is formed of a stack layer of titanium (Ti) layer/titanium nitride (TiN) layer. The barrier metal layer may be formed through a physical vapor deposition (PVD) method, e.g., a sputtering method.

Figure 1C:
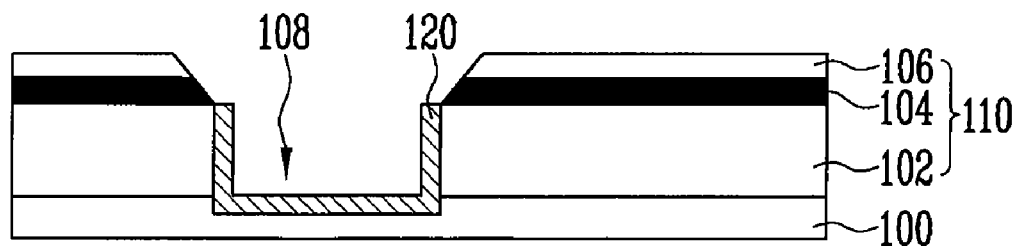

Referring to FIG. 1C, the barrier metal layer 120 formed on the insulating layer pattern 110 and side walls of the second oxide layer 106 and the nitride layer 104 constituting the insulating layer pattern 110 is removed. At this time, the barrier metal layer 120 is removed through a dry etching method, e.g., a radio-frequency etching method.

In the radio-frequency etching process for etching the barrier metal layer, a portion of the second oxide layer 106 of the insulating layer pattern 110 is slantly etched after the barrier metal layer 120 formed on the insulating layer pattern 110 is removed. Then, a portion of the nitride layer 104 is slantly etched, the radio-frequency etching process is halted at a border between the nitride layer 104 and the first oxide layer 102.

Accordingly, an etching depth is the same as a height from the barrier metal layer 120 formed on the insulating layer pattern 110 to the border between the first oxide layer 102 and the nitride layer 104, that is, the sum of a thickness of the barrier metal layer 120, a thickness of the second oxide layer 106 and a thickness of the nitride layer 104. Here, the first oxide layer 102 is placed below the etching surface.

The RF etching process is carried out under the condition of a reaction gas of argon (Ar) and a RF power of 100 to 500 W. By the above RF etching method, the barrier metal layer 120 remains on only a bottom surface of the trench 108 and a side wall of the first oxide layer 102 of the insulating layer pattern 110.

Figure 1D:
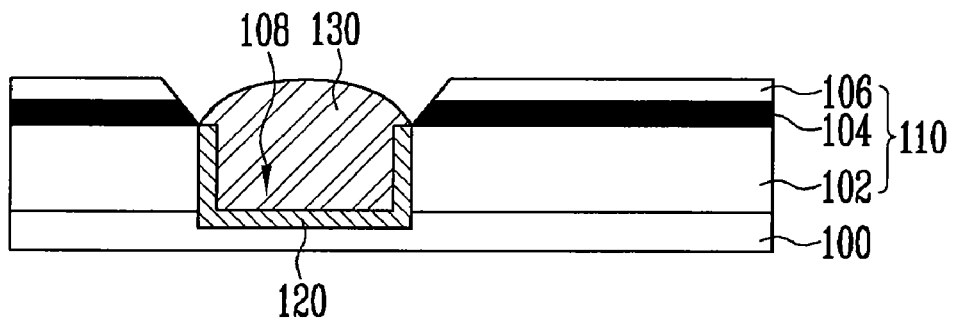

Referring to FIG. 1D, a metal layer 130 is formed on the barrier metal layer 120 in the trench 108. The metal layer 130 is made of aluminum (Al) having a low specific resistance in order to lower a resistance of a metal wire to be formed in a subsequent process.

In particular, the metal layer 130 made of aluminum is formed through a chemical vapor deposition method utilizing methyl pyrrolidine alane (MPA; $(CH_3)(CH_2)_4N.AlH_3$)) as a precursor. Methyl pyrrolidine alane is grown on the metal layer, but is not grown on the insulating layer, and so aluminum can be deposited selectively on only the barrier metal layer 120.

In more detail, in the chemical vapor deposition process utilizing a methyl pyrrolidine alane (MPA) source, a methyl pyrrolidine alane source is reacted with a surface of titanium nitride (TiN) of the barrier metal layer 120 to allow growth into islands. Then the islands which are sporadically formed are reflown by a heat treatment process to form an aluminum layer.

Here, the chemical vapor deposition method for forming the metal layer 130 (aluminum layer) utilizes methyl pyrrolidine alane (MPA) source as the precursor and is carried out at a temperature of 130° C. to 140° C. In the chemical vapor deposition process for forming selectively the aluminum layer, argon (Ar) gas or hydrogen ($H_2$) gas is used as a carrier gas for transporting the metal source. With this, the metal layer 130 (aluminum layer) with which the trench 108 is filled is formed on the barrier metal layer 120 through the aluminum chemical vapor deposition method utilizing a methyl pyrrolidine alane (MPA) source. The metal layer 130 is sufficiently formed to fill an inside of the trench 108 and upper portion of the trench 108 as well.

As described, the metal layer 130 is selectively grown on only the barrier metal layer 120, because the chemical vapor deposition method utilizing a methyl pyrrolidine alane (MPA) source as the precursor follows a deposition mechanism utilizing an electron movement between the metal layer and the lower layer.

Subsequently, in order to reflow the metal layer 130, a heat treatment process is performed in which argon gas is introduced in a chamber to increase a temperature of the semiconductor substrate 100 up to 420 to 450□. With this, a temperature of the semiconductor substrate 100 is increased to reflow the metal layer 130 formed on the barrier metal layer 120, and so the trench 108 is completely filled. That is, if the heat treatment process is performed, vacancies which may be generated when the metal layer 130 is grown on the barrier metal layer 120 are compactly filled through a reflow of the metal layer 130.

Figure 1E:
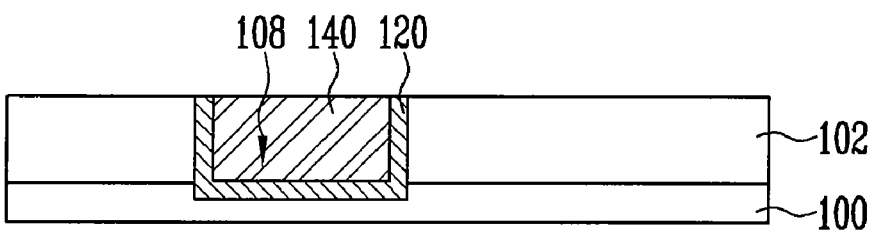

Referring to FIG. 1E, the metal layer 130 is planarized until the first oxide layer 102 of the insulating layer pattern 110 is exposed. A chemical mechanical polishing method may be used for planarizing the metal layer. At the time of planarizing the metal layer, the second oxide 106 and the nitride layer 104 of the insulating layer pattern 110 are polished. With this, a metal wire 140 is formed in the trench 108.

As described above, in an embodiment of the present invention, some of the barrier metal layer 120 is etched through the radio-frequency etching process so that the barrier metal layer 120 remains on only a bottom surface of the trench 108 and a side wall of the first oxide layer 102 of the insulating layer pattern 110, the metal layer 130 is then formed selectively on only the barrier metal layer 120 through the chemical vapor deposition method utilizing a methyl pyrrolidine alane (MPA) source as the precursor and the heat treatment process is carried out to fill completely the trench 108 with metal material, and so a gap fill efficiency of the trench 106 is increased and an area of the metal layer 130 (which should be removed in the subsequent chemical mechanical polishing process for forming the metal wire) is reduced. Consequently, the generation of dishing and scratches is reduced so that the metal wire having a low resistance may be stably formed.

Figure 1F:
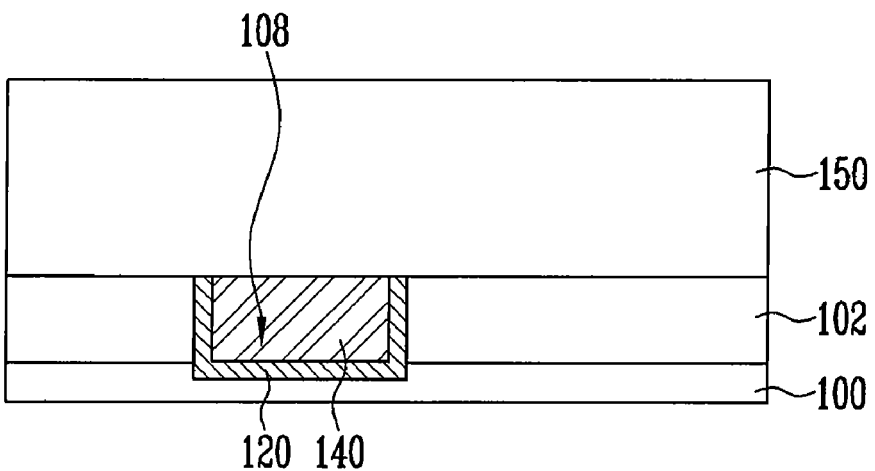

Referring to FIG. 1F, an insulating layer 150 (e.g., a boron phosphorous silicate glass layer) is formed on the first oxide layer 112 including the metal wire 140, and a subsequent process is then performed.

As described above, according to an embodiment of the present invention, the RC delay is reduced by forming a metal wire with a low resistance so that a program speed of the semiconductor device is increased and power consumption can be lowered. In addition, generation of dishing and scratches is reduced, and so a reliability of the metal wire is enhanced.

The method of forming the metal wire in the semiconductor device according to an embodiment of the present invention is applicable to the methods for manufacturing DRAM, SRAM, flash device as well as other devices in which micro conductive circuit wires are embodied.

Although the technical spirit of the present invention has been concretely described in connection with a specific embodiment, the scope of the present invention is not limited by the specific embodiments but should be construed by the appended claims. Further, it should be understood by those skilled in the art that various changes and modifications can be made thereto without departing from the scope of the present invention.

In the present invention, the barrier metal layer remains on only a bottom surface of the trench and a side wall of the first oxide layer of the insulating layer pattern through the radio frequency etching method, the metal layer having a low specific resistance is then formed selectively on only the barrier metal layer through the chemical vapor deposition method utilizing a methyl pyrrolidine alane (MPA; $(CH_3)(CH_2)_4N.AlH_3$)) source as the precursor and the heat treatment process is carried out to fill completely the trench with metal material, and so a gap fill efficiency of the trench can be enhanced to form the metal wire having a low resistance.

Since the metal wire having a low resistance is stably formed, the present invention can manufacture the semiconductor device which can reduce the RC delay to increase a program speed and can be driven with low power consumption.

In addition, the present invention reduces an area of the metal layer which should be removed in the chemical mechanical polishing process for forming the metal wire, and so generation of dishing and scratches of the metal wire may be reduced.

What is claimed is:

1. A method of forming a metal wire in a semiconductor device, the method comprising:
   performing a first etching process on an insulating layer formed on a semiconductor substrate to form a trench and an insulating layer pattern, the insulating layer pattern defining the trench;
   forming a barrier metal layer over the insulating layer pattern and the trench;
   performing a second etching process on the barrier metal layer to expose upper sidewalls of the trench while leaving the trench substantially covered with the barrier metal layer;
   forming a metal layer over the barrier metal layer in the trench after the second etching process is performed;
   performing a heat treatment process for reflowing the metal layer; and
   planarizing the metal layer.

2. The method of forming a metal wire in a semiconductor device according to claim 1, wherein the insulating layer pattern includes a first oxide layer, a nitride layer and a second oxide layer.

3. The method of forming a metal wire in a semiconductor device according to claim 1, wherein the barrier metal layer is formed of a titanium/titanium nitride (Ti/TiN) stacking layer.

4. The method of forming a metal wire in a semiconductor device according to claim 2, wherein the barrier metal layer remains on a bottom surface of the trench and a side wall of the first oxide layer of the insulating layer pattern.

5. The method of forming a metal wire in a semiconductor device according to claim 1, wherein the barrier metal layer is etched by a radio frequency (RF) etching method.

6. The method of forming a metal wire in a semiconductor device according to claim 5, wherein the RF etching process uses a reaction gas of argon (Ar) and a RF power of 100 to 500 W.

7. The method of forming a metal wire in a semiconductor device according to claim 5, wherein the insulating layer pattern includes a first oxide layer, a nitride layer and a second oxide layer in sequence, wherein the radio-frequency etching process is performed such that a portion of the second oxide layer of the insulating layer pattern is slantly etched after the barrier metal layer formed on the insulating layer pattern is removed and a portion of the nitride layer is slantly etched, wherein the radio-frequency etching process is halted at a border between the nitride layer and the first oxide layer.

8. The method of forming a metal wire in a semiconductor device according to claim 1, wherein the metal layer includes aluminum.

9. The method of forming a metal wire in a semiconductor device according to claim 8, wherein the aluminum is deposited through a chemical vapor deposition (CVD) method utilizing methyl pyrrolidine alane (MPA; $(CH_3)(CH_2)_4N.AlH_3$)) source as a precursor.

10. The method of forming a metal wire in a semiconductor device according to claim 9, wherein the chemical vapor deposition method utilizing methyl pyrrolidine alane (MPA) source as the precursor is performed at a temperature of 130° C. to 140° C.

11. The method of forming a metal wire in a semiconductor device according to claim 1, wherein the semiconductor substrate is heated to a temperature of 420° C.-to 450° C. during the heat treatment process.

12. The method of forming a metal wire in a semiconductor device according to claim 1, wherein the insulating layer pattern includes a first oxide layer provided over the substrate, a nitride layer provided over the first oxide layer, and a second oxide layer provided over the nitride layer, wherein the metal layer is planarized by a chemical mechanical polishing process, wherein the chemical mechanical polishing process is performed until the nitride layer of the insulating layer pattern is exposed.

13. The method of forming a metal wire in a semiconductor device according to claim 12, wherein the second oxide layer and the nitride layer of the insulating layer pattern are removed during the planarizing step.

14. The method of forming a metal wire in a semiconductor device according to claim 1, further comprising: forming a hard mask layer before the first etching process.

15. The method of forming a metal wire in a semiconductor device according to claim 1, further comprising: forming a dielectric layer after planarizing the metal layer.

* * * * *